United States Patent
Yao et al.

(10) Patent No.: US 11,575,384 B2
(45) Date of Patent: Feb. 7, 2023

(54) FREQUENCY DIVIDER CIRCUIT

(71) Applicant: Sigmastar Technology Ltd., Xia'men (CN)

(72) Inventors: Chao-Fan Yao, Xiamen (CN); Kai Sun, Xiamen (CN)

(73) Assignee: SIGMASTAR TECHNOLOGY LTD., Xia'men (CN)

( * ) Notice: Subject to any disclaimer, the term of this patent is extended or adjusted under 35 U.S.C. 154(b) by 0 days.

(21) Appl. No.: 17/564,262

(22) Filed: Dec. 29, 2021

(65) Prior Publication Data

US 2022/0239300 A1    Jul. 28, 2022

(30) Foreign Application Priority Data

Jan. 28, 2021  (CN) .......................... 202110119978.X

(51) Int. Cl.
*H03L 7/18*       (2006.01)
*G11C 11/4076*    (2006.01)

(52) U.S. Cl.
CPC ............ *H03L 7/18* (2013.01); *G11C 11/4076* (2013.01)

(58) Field of Classification Search
CPC .............................. H03L 7/18; G11C 11/4076
See application file for complete search history.

(56) References Cited

U.S. PATENT DOCUMENTS

| | | | | |
|---|---|---|---|---|
| 5,065,415 A * | 11/1991 | Yamashita | ........... | H03K 23/667 377/110 |
| 5,087,829 A * | 2/1992 | Ishibashi | .................. | H03K 5/15 327/295 |
| 6,750,686 B2 * | 6/2004 | Wang | ................... | H03K 23/667 327/117 |
| 7,042,257 B2 * | 5/2006 | Wang | ..................... | H03K 23/68 327/117 |
| 7,109,762 B2 * | 9/2006 | Neurauter | ............ | H03K 23/667 327/117 |
| 7,205,798 B1 * | 4/2007 | Agarwal | ................. | H03L 7/081 327/107 |
| 7,342,520 B1 * | 3/2008 | Katzman | ................... | H03L 7/18 341/100 |
| 8,406,371 B1 * | 3/2013 | Barale | .................. | H03K 21/023 377/47 |
| 9,147,463 B1 * | 9/2015 | Sarraju | ..................... | G11C 7/22 |
| 9,577,646 B1 * | 2/2017 | Pandita | ................. | H03L 7/1976 |

(Continued)

FOREIGN PATENT DOCUMENTS

EP           3985876 A1 *  4/2022  ............. H03L 7/087

*Primary Examiner* — Adam D Houston
(74) *Attorney, Agent, or Firm* — WPAT, PC

(57) ABSTRACT

A frequency divider circuit is provided. The frequency divider circuit processes multiple input clocks. The frequency divider circuit includes a frequency dividing circuit and a retiming circuit. The frequency dividing circuit generates an intermediate clock according to a first subgroup of the input clocks. The retiming circuit generates multiple output clocks according to a second subgroup of the input clocks and the intermediate clock. The periods of the input clocks are all a first period, and the periods of the output clocks are all a second period. The first period is smaller than the second period. The frequency dividing circuit and the retiming circuit operate according to a mode control signal which determines a ratio of the first period to the second period.

15 Claims, 13 Drawing Sheets

(56) References Cited

U.S. PATENT DOCUMENTS

| | | | |
|---|---|---|---|
| 10,411,714 B2* | 9/2019 | Yanagihara | H03K 21/08 |
| 10,700,669 B2* | 6/2020 | Baladhandapani | H03K 21/026 |
| 2002/0131538 A1* | 9/2002 | Staszewski | H03L 7/18 |
| | | | 375/355 |
| 2003/0155953 A1* | 8/2003 | Hirata | H03L 7/0814 |
| | | | 327/236 |
| 2004/0196940 A1* | 10/2004 | Chien | H03K 23/665 |
| | | | 375/376 |
| 2005/0058236 A1* | 3/2005 | Ke | H03K 23/667 |
| | | | 377/49 |
| 2006/0164132 A1* | 7/2006 | Martin | H03L 7/081 |
| | | | 327/105 |
| 2008/0013663 A1* | 1/2008 | Cornelius | G11C 7/222 |
| | | | 375/372 |
| 2008/0100354 A1* | 5/2008 | Lee | H03L 7/095 |
| | | | 327/158 |
| 2011/0089987 A1* | 4/2011 | Yang | H03K 21/12 |
| | | | 327/295 |
| 2011/0248752 A1* | 10/2011 | Willey | G11C 11/4076 |
| | | | 327/158 |
| 2011/0285443 A1* | 11/2011 | Suzawa | G01R 31/31919 |
| | | | 327/199 |
| 2013/0082748 A1* | 4/2013 | Karalar | H03K 21/023 |
| | | | 327/115 |
| 2014/0312936 A1* | 10/2014 | Abdel-Haleem | H03K 23/54 |
| | | | 327/118 |
| 2015/0200674 A1* | 7/2015 | Chaivipas | H03L 7/18 |
| | | | 327/153 |
| 2015/0357017 A1* | 12/2015 | Diffenderfer | G11C 11/4076 |
| | | | 327/158 |
| 2016/0006559 A1* | 1/2016 | Arai | H04L 25/00 |
| | | | 375/376 |
| 2017/0338825 A1* | 11/2017 | Lee | H03L 7/10 |
| 2020/0228123 A1* | 7/2020 | Oh | G06F 1/06 |
| 2021/0313993 A1* | 10/2021 | Bai | H04L 7/005 |
| 2021/0358534 A1* | 11/2021 | Choi | H03L 7/0818 |
| 2022/0239300 A1* | 7/2022 | Yao | H03L 7/18 |

\* cited by examiner

FREQUENCY DIVIDER CIRCUIT

BACKGROUND OF THE INVENTION

1. Field of the Invention

The present invention generally relates to frequency divider circuits, and, more particularly, to multi-phase dual-mode frequency divider circuits.

2. Description of Related Art

As the information technology advances, applications such as high-density computing, intensive image processing, and massive data transmission have higher demands on bandwidths for input/output ports. The processing of multi-phase clocks is also becoming more important and complicated. In particular, issues such as clock skew in parallel transmission have become increasingly challenging when dealing with Giga-Hertz (GHz)-level high-speed signals. Thus, an ideal phase relationship should be obtained, which requires the frequency divider circuit to maintain the same input and output time delay when processing multi-path signals of different phases.

Meanwhile, the widely-used frequency divider circuits are usually built with D-Flip Flops (DFFs); in operation, the signals should meet the setup time requirement and the hold time requirement of the DFFs. Specifically, to meet the setup time requirement, the input data that the flip-flop receives must remain stable for a certain period of time prior to the arrival of the active edge (which can be a rising edge and/or a falling edge) of the clock; to meet the hold time requirement, the input data that the flip-flop receives should still remain stable for a certain period of time after the arrival of the active edge of the clock. In general, the operation speed of the DFF is restricted by the setup time. In the case of a certain manufacturing process and DFF setup time, higher signal processing speed demands reasonably optimized design of the frequency divider circuit structure.

SUMMARY OF THE INVENTION

In view of the issues of the prior art, an object of the present invention is to provide a frequency divider circuit, so as to make an improvement to the prior art.

According to one aspect of the present invention, a frequency divider circuit for processing N input clocks to generate N output clocks is provided. The frequency divider circuit includes a frequency dividing circuit and a retiming circuit. The frequency dividing circuit generates an intermediate clock according to a first subgroup of the N input clocks. The retiming circuit generates N−1 output clocks according to a second subgroup of the N input clocks and the intermediate clock. The periods of the N input clocks are a first period, the periods of the N output clocks are a second period, and the first period is smaller than the second period. The frequency dividing circuit and the retiming circuit operate according to a mode control signal, and the mode control signal determines a ratio of the first period to the second period.

According to another aspect of the present invention, a frequency divider circuit is provided. The frequency divider circuit includes a frequency dividing circuit and a retiming circuit. The frequency dividing circuit generates a first intermediate clock according to a first subgroup of the input clocks. The retiming circuit generates multiple output clocks according to a second subgroup of the input clocks and the first intermediate clock. The periods of the input clocks are a first period, the periods of the output clocks are a second period, and the first period is smaller than the second period. The frequency dividing circuit and the retiming circuit operate according to a mode control signal, and the mode control signal determines a ratio of the first period to the second period. The retiming circuit includes multiple retiming circuit units which include a first retiming circuit unit and a second retiming circuit unit. The first retiming circuit unit generates a second intermediate clock according to a first input clock of the second subgroup, and the second retiming circuit unit generates a first output clock of the output clocks according to a second input clock of the second subgroup and the second intermediate clock. The second input clock leads the first input clock and the first output clock.

In comparison with the conventional technology, the dual-mode frequency divider circuit of the present invention has a longer setup time (i.e., easier to meet the setup time requirement), and can therefore achieve a higher signal processing speed.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes frequency divider circuits. On account of that some or all elements of the frequency divider circuits could be known, the detail of such elements is omitted provided that such detail has little to do with the features of this disclosure, and that this omission nowhere dissatisfies the specification and enablement requirements.

People having ordinary skill in the art know that the symbol "S<X>" represents the $X^{th}$ signal of multiple numbered signals S. Throughout this specification, unless specifically specified, the starting number of multiple numbered signals S is zero, namely, S<0>, S<1>, S<2>, . . . . The expression "S<Y:X>" (Y>X) represents a total number of Y−X+1 signals S that are made up of S<Y>, S<Y−1>, S<X+1>, and S<X>. The expression "S<Y:X:Z>" represents multiple signals from S<Y> to S<X> in steps of −Z (i.e., including S<Y>, S<Y−Z>, S<Y−2Z>, S<X+Z>, and S<X>), and "S<Y:X:1>" is equivalent to "S<Y:X>." In addition, people having ordinary skill in the art can appreciate that the scope of "operating according to the signal S" encompasses "operating according to the inverted signal of the signal S."

Figure 1:
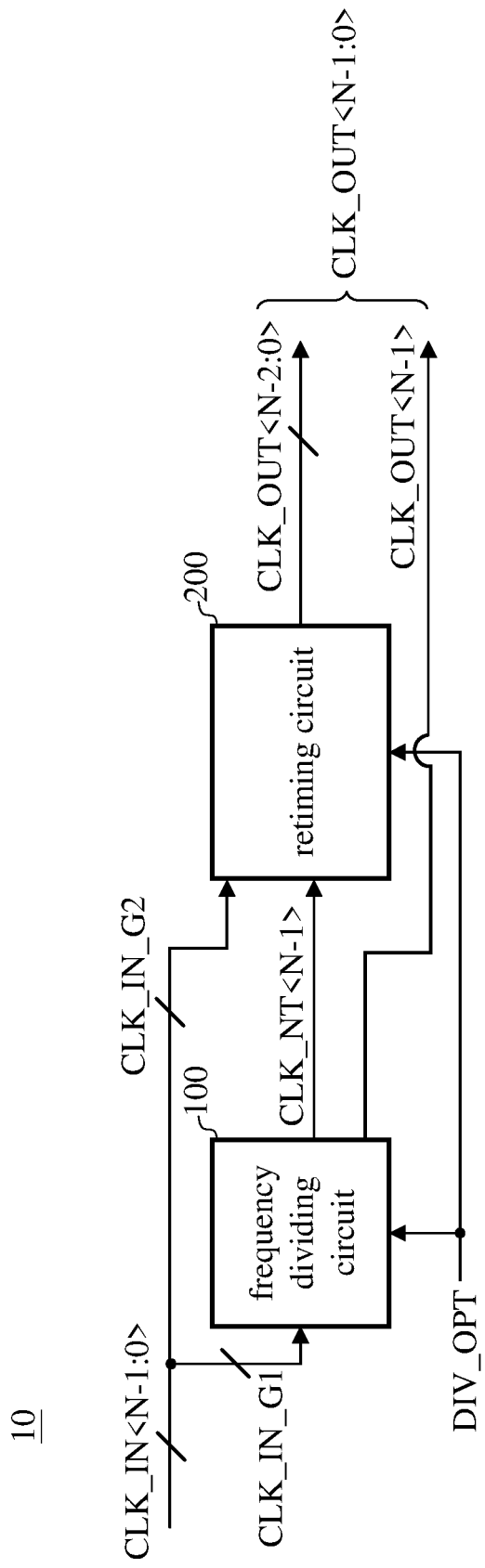
FIG. 1 illustrates a functional block diagram of the frequency divider circuit according to an embodiment of the present invention.

FIG. 1 is a functional block diagram of the frequency divider circuit according to an embodiment of the present invention. The dual-mode frequency divider circuit 10 includes a frequency dividing circuit 100 and a retiming circuit 200. The dual-mode frequency divider circuit 10 processes the input clock group CLK_IN<N−1:0> (N=2n, n being a positive integer) according to the mode control signal DIV_OPT to generate the output clock group CLK_OUT<N−1:0>. The input clock group CLK_IN<N−1:0> includes the first input clock subgroup CLK_IN_G1 and the second input clock subgroup CLK_IN_G2. The first input clock subgroup CLK_IN_G1 and the second input clock subgroup CLK_IN_G2 each include at least one input clock CLK_IN<Y> (0≤Y≤N−1).

The frequency dividing circuit 100 generates the output clock CLK_OUT<N−1> and the intermediate clock CLK_NT<N−1> according to the mode control signal DIV_OPT and the first input clock subgroup CLK_IN_G1. The retiming circuit 200 is coupled to the frequency dividing circuit 100 and configured to generate the output clock subgroup CLK_OUT<N−2:0> according to the mode control signal DIV_OPT, the second input clock subgroup CLK_IN_G2, and the intermediate clock CLK_NT<N−1>. The output clock CLK_OUT<N−1> and the output clock subgroup CLK_OUT<N−2:0> constitute the output clock group CLK_OUT<N−1:0>.

All the periods of the N clocks of the input clock group CLK_IN<N−1:0> are the first period Tin, and all the periods of the N clocks of the output clock group CLK_OUT<N−1:0> are the second period Tout. The first period Tin is smaller than the second period Tout. The ratio of the first period Tin to the second period Tout is determined by the mode control signal DIV_OPT; that is, the divisor of the dual-mode frequency divider circuit 10 is determined by the mode control signal DIV_OPT. More specifically, when the mode control signal DIV_OPT is the first logical value, Tout/Tin is the first divisor D1; when the mode control signal DIV_OPT is the second logical value, Tout/Tin is the second divisor D2. The first logical value is different from the second logical value.

Figure 2:
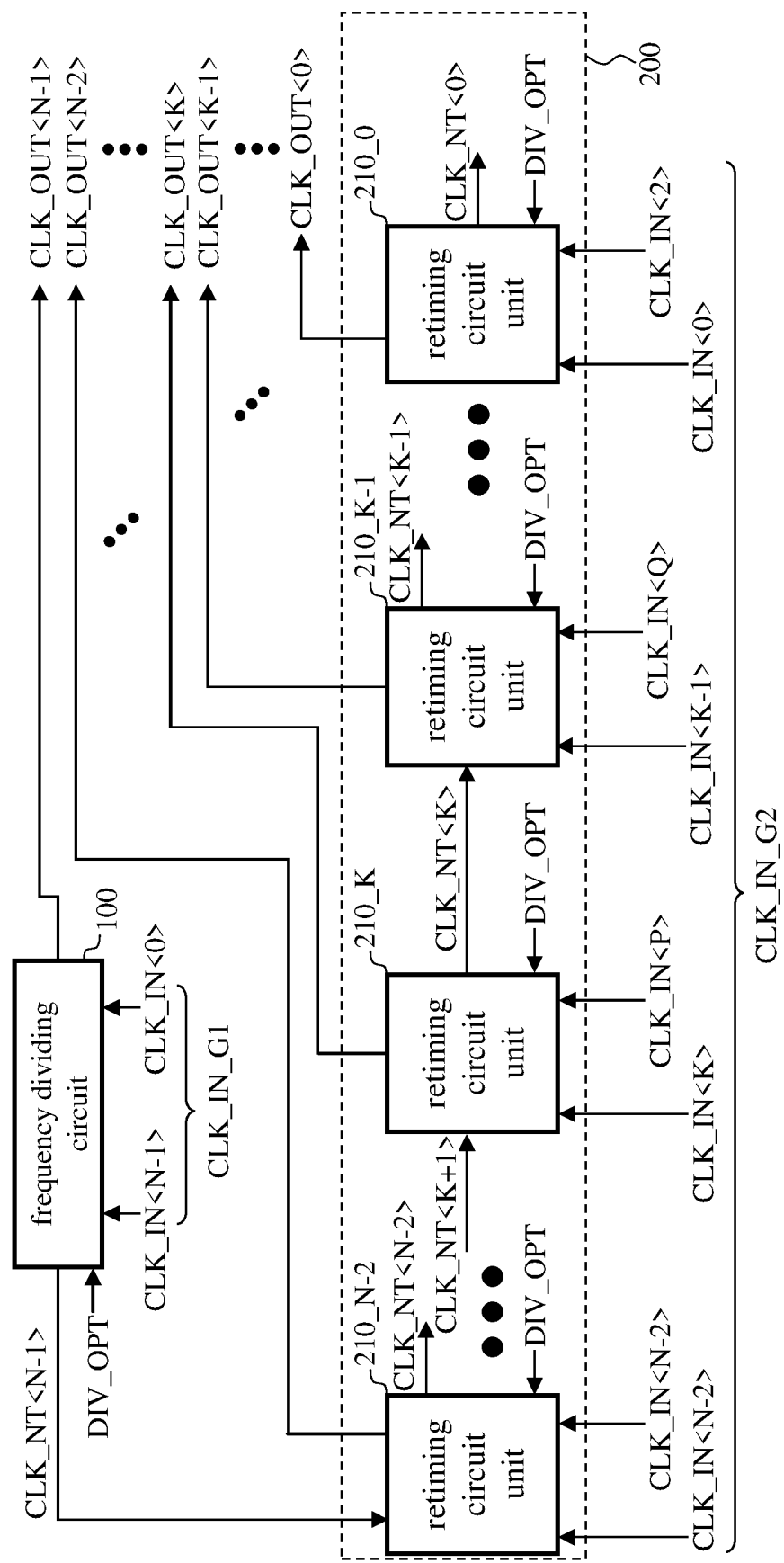
FIG. 2 illustrates a functional block diagram of the dual-mode frequency divider circuit 10 of FIG. 1 according to an embodiment.

FIG. 2 is a functional block diagram of the dual-mode frequency divider circuit 10 of FIG. 1 according to an embodiment. The retiming circuit 200 includes N−1 sequentially connected retiming circuit units 210 (i.e., 210_0, 210_1, . . . , 210_K−1, 210_K, . . . , and 210_N−2, K being an integer and 1≤K≤N−2). In some embodiments, the first input clock subgroup CLK_IN_G1 includes the input clock CLK_IN<N−1> and the input clock CLK_IN<0>, and the second input clock subgroup CLK_IN_G2 includes the input clocks CLK_IN<N−2>, CLK_IN<N−3>, CLK_IN<K>, CLK_IN<K−1>, CLK_IN<0>, CLK_IN<P>, and CLK_IN<Q>.

Each retiming circuit unit 210 generates an intermediate clock. For example, the retiming circuit unit 210_0 generates the intermediate clock CLK_NT<0>, and the retiming circuit unit 210_K generates the intermediate clock CLK_NT<K>. Of the retiming circuit units 210, the retiming circuit unit 210_N−2 receives the intermediate clock CLK_NT<N−1> that the frequency dividing circuit 100 generates, while other retiming circuit units 210_0 to 210_N−3 receive the intermediate clock that their respective preceding retiming circuit unit generates; that is, the retiming circuit unit 210_K−1 receives the intermediate clock CLK_NT<K> that the retiming circuit unit 210_K generates. The output clock CLK_OUT<Y> and the intermediate clock CLK_NT<Y> are each other's inverted signals.

Figure 3:
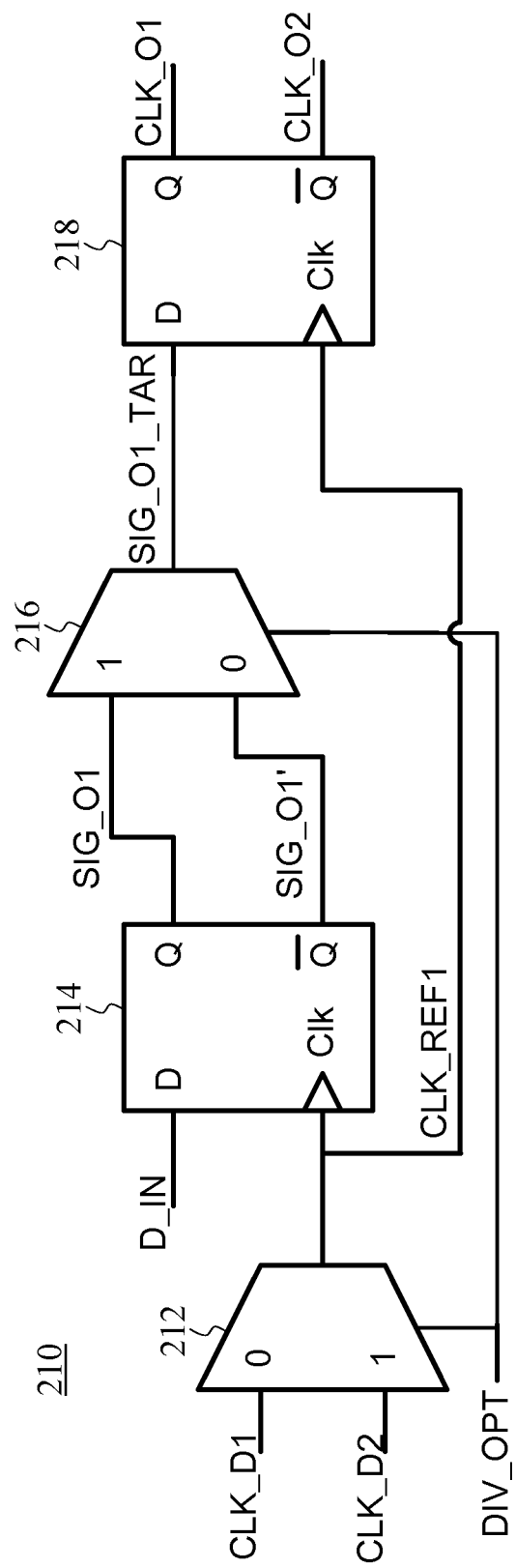
FIG. 3 illustrates a functional block diagram of the retiming circuit unit 210 according to an embodiment.

FIG. 3 shows a functional block diagram of the retiming circuit unit 210 according to an embodiment. The retiming circuit unit 210 of FIG. 3 can be used to embody any of the retiming circuit units 210_0, 210_1, . . . , 210_K−1, 210_K, . . . , and 210_N−2. The retiming circuit unit 210 includes a multiplexer 212, a D flip-flop (DFF) 214, a multiplexer 216, and a DFF 218. The multiplexer 212 receives the input clock CLK_D1 and the input clock CLK_D2, and selects the input clock CLK_D1 or the input clock CLK_D2 as the reference clock CLK_REF1 according to the mode control signal DIV_OPT. The DFF 214 samples the intermediate clock D_IN according to the reference clock CLK_REF1 to generate the intermediate signal SIG_O1. The multiplexer 216 receives the intermediate signal SIG_O1 and the inverted signal SIG_O1' of the intermediate signal SIG_O1, and selects the intermediate signal SIG_O1 or the inverted signal SIG_O1' of the intermediate signal SIG_O1 as the target intermediate signal SIG_O1_TAR according to the mode control signal DIV_OPT. The DFF 218 samples the target intermediate signal SIG_O1_TAR according to the reference clock CLK_REF1 to generate the output clock CLK_O1 and the output clock CLK_O2. The output clock CLK_O1 and the output clock CLK_O2 are each other's inverted signals.

For the retiming circuit unit 210_N−2, the input clock CLK_D1 and the input clock CLK_D2 are both the input clock CLK_IN<N−2>, the intermediate clock D_IN is the intermediate clock CLK_NT<N−1>, the output clock CLK_O1 is the output clock CLK_OUT<N−2>, and the output clock CLK_O2 is the intermediate clock CLK_NT<N−2>.

For the retiming circuit unit 210_K−1, the input clock CLK_D1 is the input clock CLK_IN<K−1>, the input clock CLK_D2 is the input clock CLK_IN<Q>, the intermediate clock D_IN is the intermediate clock CLK_NT<K>, the output clock CLK_O1 is the output clock CLK_OUT<K−1>, and the output clock CLK_O2 is the intermediate clock CLK_NT<K−1>.

In some embodiments, when the first divisor D1=2 and the second divisor D2=4, the input clocks CLK_D1 of the retiming circuit units 210_N−2, 210_N−3, . . . , 210_1, and 210_0 are respectively the input clocks CLK_IN<N−2>, CLK_IN<N−3>, CLK_IN<1>, and CLK_IN<0>, and the input clocks CLK_D2 of the retiming circuit units 210_N−2, 210_N−3, 210_(N−2)/2, 210_(N−2)/2-1, 210_(N−2)/2-2, 210_1, and 210_0 are respectively the input clocks CLK_IN<N−2>, CLK_IN<N−4>, CLK_IN<0>, CLK_IN<N−2>, CLK_IN<N−4>, CLK_IN<4>, and CLK_IN<2>. In other words, the multiple input clocks CLK_D1 of the retiming circuit 200 can be expressed as "CLK_IN<N−2:0:1>," and the multiple input clocks CLK_D2 of the retiming circuit 200 can be expressed as "CLK_IN<N−2:0:2,N−2:2:2>." Therefore, the input clock CLK_IN<P> and the input clock CLK_IN<Q> can be expressed as follows.

$$P = \begin{cases} 2 \times \left(K - \dfrac{N}{2} + 1\right) & \text{when } K \geq \dfrac{N}{2} - 1 \\ N + 2 \times \left(K - \dfrac{N}{2} + 1\right) & \text{when } K < \dfrac{N}{2} - 1 \end{cases} \quad (1)$$

$$Q = \begin{cases} 2 \times \left(K - \dfrac{N}{2}\right) & \text{when } K \geq \dfrac{N}{2} \\ N + 2 \times \left(K - \dfrac{N}{2}\right) & \text{when } K < \dfrac{N}{2} \end{cases} \quad (2)$$

Figure 4:
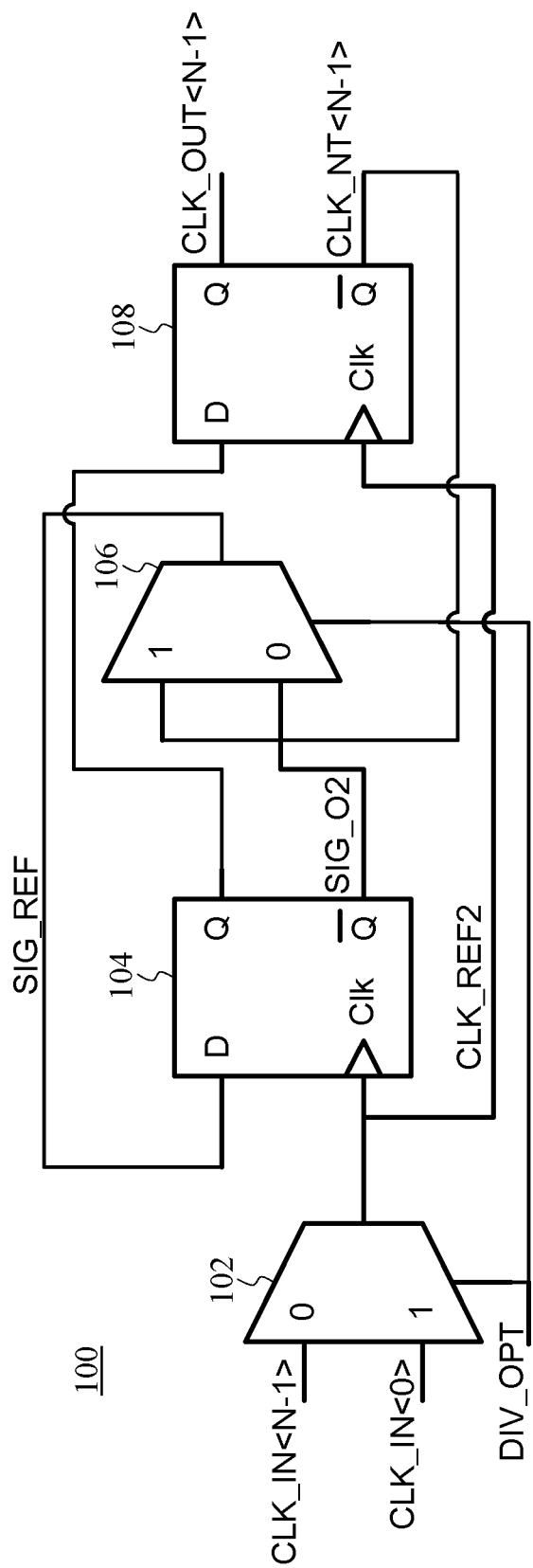
FIG. 4 illustrates a functional block diagram of the frequency dividing circuit 100 according to an embodiment.

FIG. 4 shows a functional block diagram of the frequency dividing circuit 100 according to an embodiment. The frequency dividing circuit 100 includes a multiplexer 102, a DFF 104, a multiplexer 106, and a DFF 108. The multiplexer 102 receives the input clock CLK_IN<0> and the input clock CLK_IN<N−1>, and selects the input clock CLK_IN<0> or the input clock CLK_IN<N−1> as the reference clock CLK_REF2 according to the mode control signal DIV_OPT. The multiplexer 106 receives the intermediate signal SIG_O2 and the intermediate clock CLK_NT<N−1>, and selects the intermediate signal SIG_O2 or the intermediate clock CLK_NT<N−1> as the reference signal SIG_REF according to the mode control signal DIV_OPT. The DFF 104 samples the reference signal SIG_REF according to the reference clock CLK_REF2 to generate the intermediate signal SIG_O2 and its inverted signal. The DFF 108 samples the inverted signal of the intermediate signal SIG_O2 according to the reference clock CLK_REF2 to generate the output clock CLK_OUT<N−1> and the intermediate clock CLK_NT<N−1>.

Figure 5:
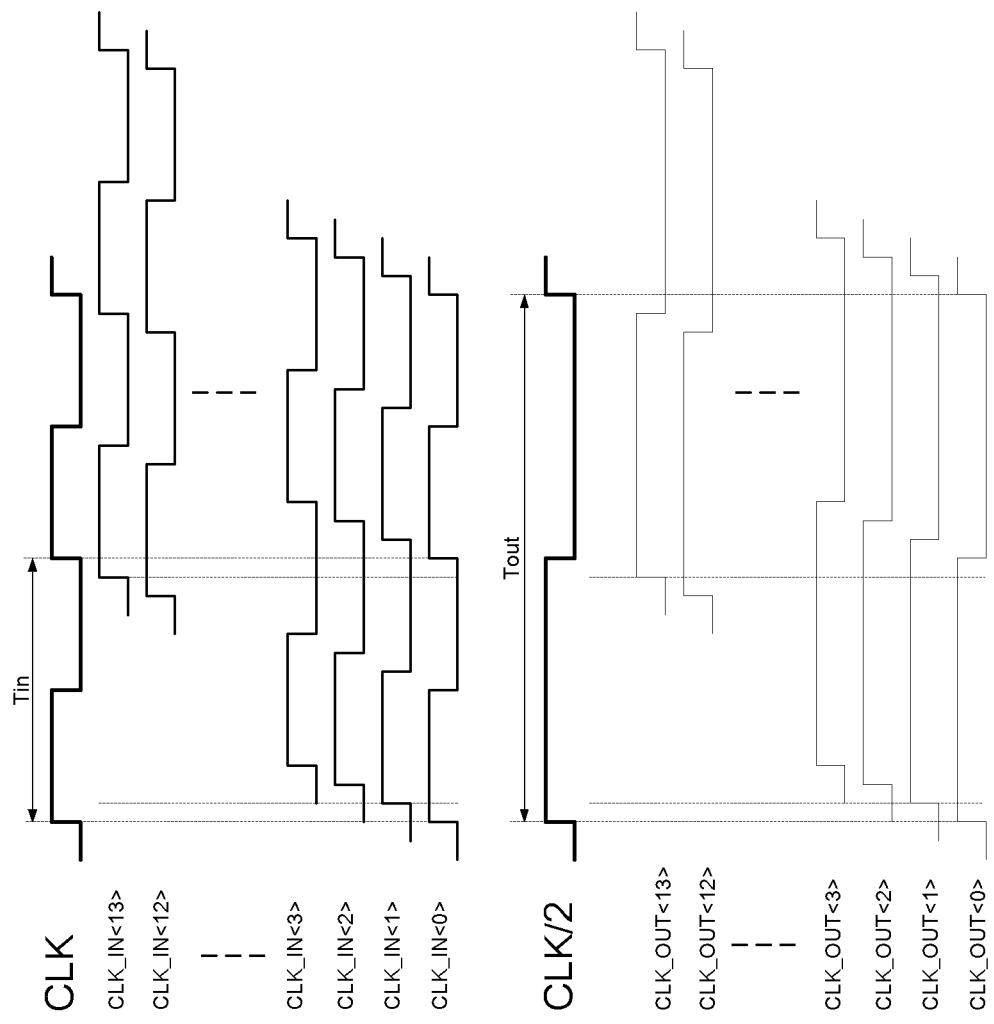
FIG. 5 illustrates a timing diagram of N input clocks and N output clocks.
Figure 6:
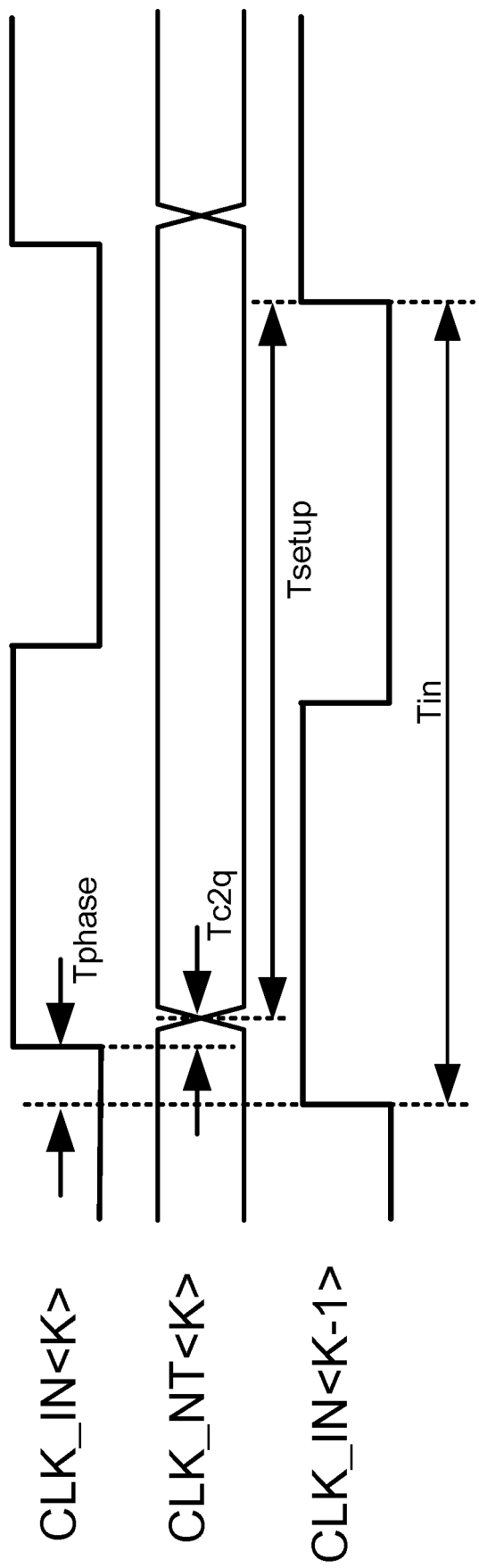
FIG. 6 illustrates the relationship between the input clock CLK_IN<K>, the input clock CLK_IN<K−1>, and the intermediate clock CLK_NT<K>.

FIG. 5 shows a timing diagram of N input clocks CLK_IN and N output clocks CLK_OUT. In the example timing diagram of FIG. 5, N is 14; this, however, is intended to illustrate the invention by way of examples, rather than to limit the scope of the claimed invention. In the example timing diagram of FIG. 5, the mode control signal DIV_OPT is logic 0, and the first divisor D1 is two. As shown in FIG. 3, when the mode control signal DIV_OPT is logic 0, the reference clock CLK_REF1 is the input clock CLK_D1. For the retiming circuit unit 210_K−1 of FIG. 2, it samples the intermediate clock CLK_NT<K>, which is the inverted signal of the output clock CLK_OUT<K>, according to the input clock CLK_IN<K−1>. Reference is made to FIG. 6 which shows the relationship between the input clock CLK_IN<K>, the input clock CLK_IN<K−1>, and the intermediate clock CLK_NT<K>. The input clock CLK_IN<K−1> leads the input clock CLK_IN<K> by the phase difference Tphase (Tphase=Tin/N<Tin/2), and the input clock CLK_IN<K> leads the intermediate clock CLK_NT<K> by the phase difference Tc2q (i.e., the delay caused by the internal components of the retiming circuit unit 210 is approximately Tc2q). Because Tphase+Tc2q<Tin/2, the input clock CLK_IN<K−1> leads the intermediate clock CLK_NT<K> by a phase difference of Tphase+Tc2q. In other words, the retiming circuit unit 210 samples a lagging clock (i.e., the intermediate clock CLK_NT<K>) according to a leading clock (i.e., the input clock CLK_IN<K−1>). As shown in FIG. 6, the time interval Tsetup from the transition of the intermediate clock CLK_NT<K> to the sampling of the intermediate clock CLK_NT<K> by the input clock CLK_IN<K−1> is greater than Tin/2. In other words, the setup time of the dual-mode frequency divider circuit 10 (i.e., the time interval Tsetup) is quite long. In comparison, the setup time of the conventional frequency divider circuit is less than Tin/2 because the conventional frequency divider circuit does not sample a lagging clock using a leading clock.

Figure 7:
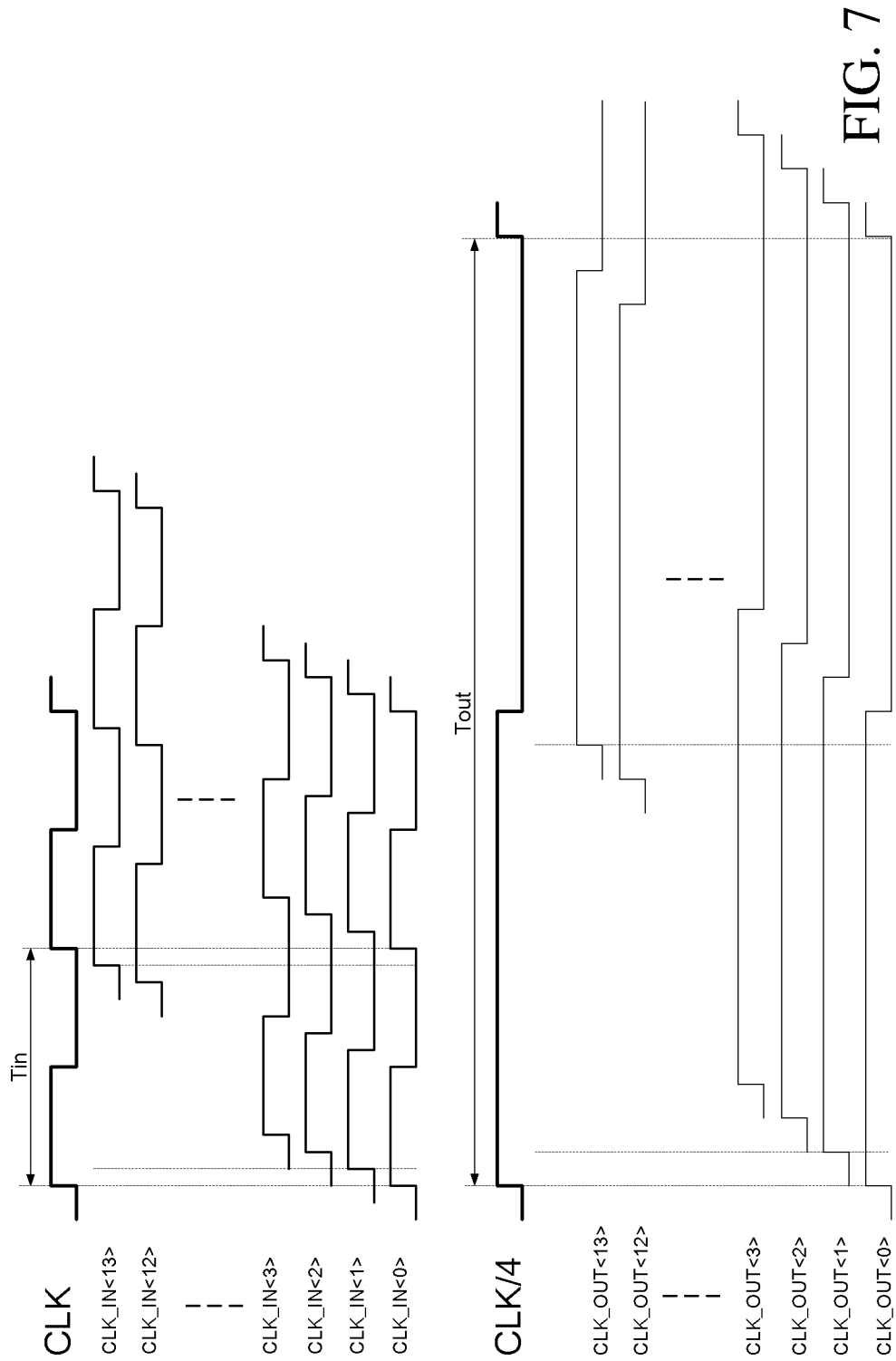
FIG. 7 illustrates a timing diagram of N input clocks and N output clocks.

FIG. 7 shows a timing diagram of N input clocks CLK_IN and N output clocks CLK_OUT. In the example timing diagram of FIG. 7, N is 14; this, however, is intended to illustrate the invention by way of examples, rather than to limit the scope of the claimed invention. In the example timing diagram of FIG. 7, the mode control signal DIV_OPT is logic 1, and the second divisor D2 is four. As shown in FIG. 3, when the mode control signal DIV_OPT is logic 1, the reference clock CLK_REF1 is the input clock CLK_D2. For the retiming circuit unit 210_K−1 of FIG. 2, it samples the intermediate clock CLK_NT<K> according to the input clock CLK_IN<Q>. Likewise, people having ordinary skill in the art can know from FIG. 6 and its descriptions that the input clock CLK_IN<Q> leads the intermediate clock CLK_NT<K>.

As shown in FIG. 5 and FIG. 7, the greatest phase difference between the N input clocks CLK_IN<N−1:0> (i.e., the phase difference between CLK_IN<N−1> and CLK_IN<0>) is greater than Tin/2 (i.e., greater than 180 degrees), and the N input clocks CLK_IN<N−1:0> equally divide the entire first period Tin (i.e., a phase of 360 degrees), the greatest phase difference between the N output clocks CLK_OUT<N−1:0> (i.e., the phase difference between CLK_OUT<N−1> and CLK_OUT<0>) is smaller than Tout/2 (i.e., smaller than 180 degrees), and the N output clocks CLK_OUT<N−1:0> equally divide half of the second period Tout (i.e., a phase of 180 degrees).

As shown in FIGS. 3 and 4, each retiming circuit unit 210 and the frequency dividing circuit 100 are made up of two DFFs and two multiplexers, and the difference is that the connections of the components are different. Such design can significantly reduce the differences in the transmission path delay between the clock signals of different phases; thus, eventually, the same phase difference between any two contiguous output clocks can be ensured.

Figure 8:
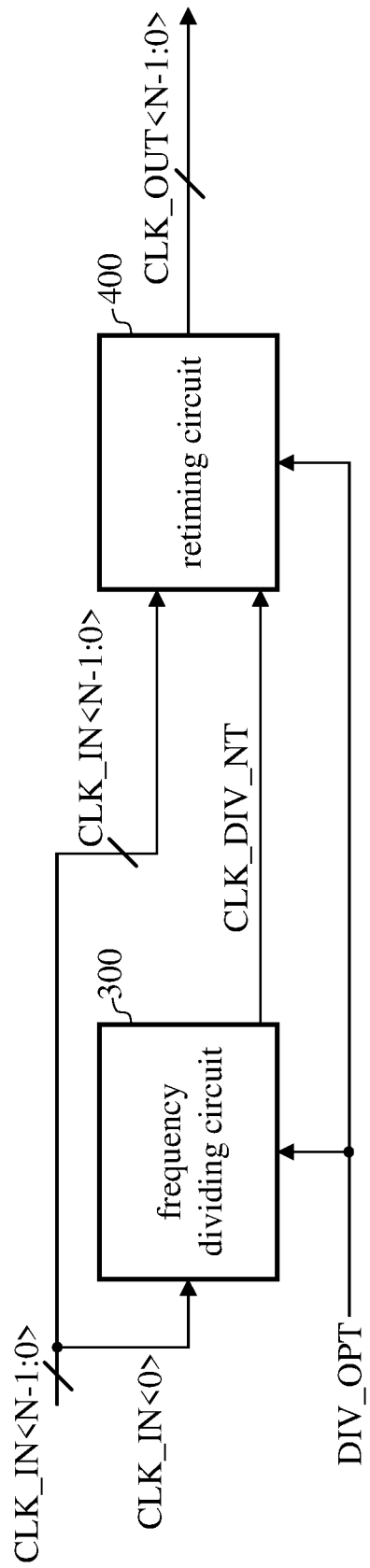
FIG. 8 illustrates a functional block diagram of the frequency divider circuit according to an embodiment of the present invention.

FIG. 8 is a functional block diagram of the frequency divider circuit according to an embodiment of the present invention. The dual-mode frequency divider circuit 20 includes a frequency dividing circuit 300 and a retiming circuit 400. The dual-mode frequency divider circuit 20 processes the input clock group CLK_IN<N−1:0> according to the mode control signal DIV_OPT to generate the output clock group CLK_OUT<N−1:0>.

All the periods of the N clocks of the input clock group CLK_IN<N−1:0> are the first period Tin, and all the periods of the N clocks of the output clock group CLK_OUT<N−1:0> are the second period Tout. The first period Tin is smaller than the second period Tout. The ratio of the first period Tin to the second period Tout is determined by the mode control signal DIV_OPT; that is, the divisor of the dual-mode frequency divider circuit 20 is determined by the mode control signal DIV_OPT. Similar to the embodiment of FIG. 1, the N input clocks CLK_IN in FIG. 8 equally divide the entire period (i.e., a phase of 360 degrees) of the first period Tin, and the N output clocks CLK_OUT equally divide a half period (i.e., a phase of 180 degrees) of the second period Tout.

The frequency dividing circuit 300 generates an intermediate clock CLK_DIV_NT according to the mode control signal DIV_OPT and the input clock CLK_IN<0>. The period of the intermediate clock CLK_DIV_NT is the second period Tout. The retiming circuit 400 generates the output clock group CLK_OUT<N−1:0> according to the mode control signal DIV_OPT, the input clock group CLK_IN<N−1:0>, and the intermediate clock CLK_DIV_NT.

The retiming circuit 400 includes N retiming circuit units 410 connected in sequence. People having ordinary skill in the art can learn the detailed circuit of the retiming circuit 400 based on FIGS. 2 and 8 and the following discussions.

Figure 9:
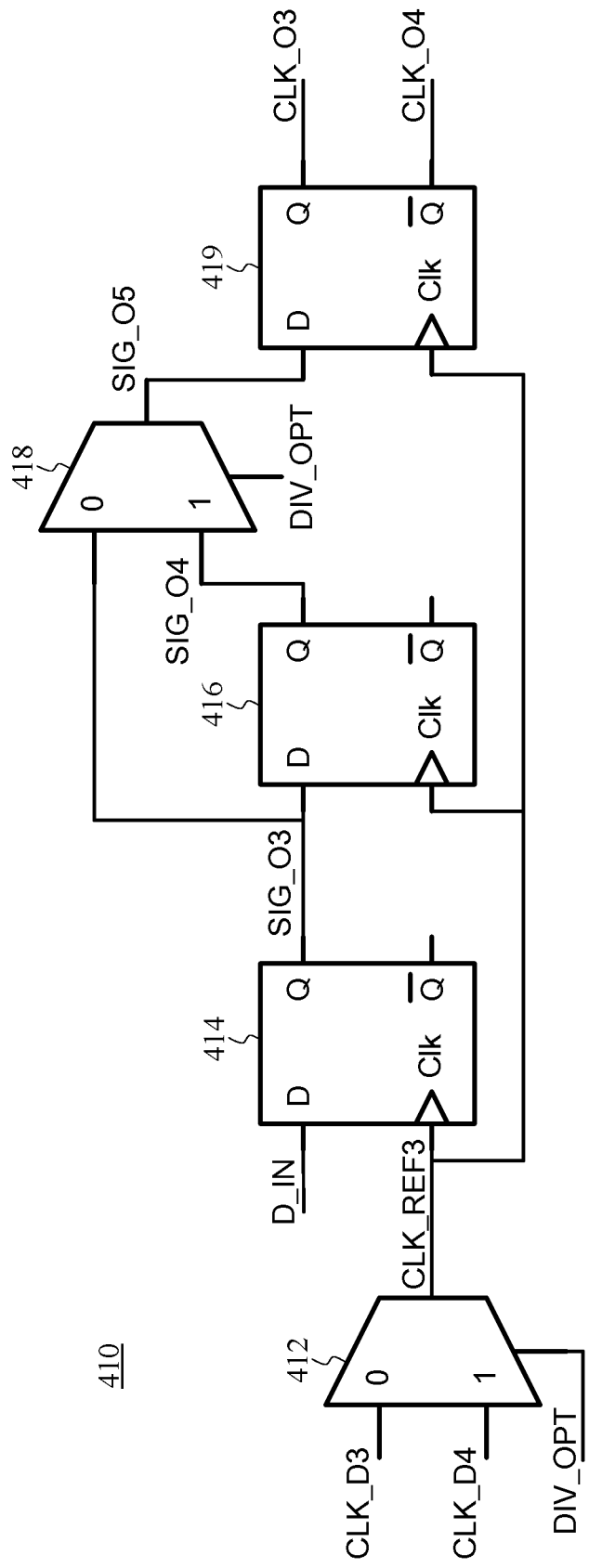
FIG. 9 illustrates a functional block diagram of the retiming circuit unit 410 according to an embodiment.

FIG. 9 shows a functional block diagram of the retiming circuit unit 410 according to an embodiment. The retiming circuit unit 410 includes a multiplexer 412, a DFF 414, a DFF 416, a multiplexer 418, and a DFF 419. The multiplexer 412 receives the input clock CLK_D3 and the input clock CLK_D4, and selects the input clock CLK_D3 or the input clock CLK_D4 as the reference clock CLK_REF3 according to the mode control signal DIV_OPT. The DFF 414 samples the intermediate clock D_IN according to the reference clock CLK_REF3 to generate the intermediate signal SIG_O3. The DFF 416 samples the intermediate signal SIG_O3 according to the reference clock CLK_REF3 to generate the intermediate signal SIG_O4. The multiplexer 418 receives the intermediate signal SIG_O3 and the intermediate signal SIG_O4, and selects the intermediate signal SIG_O3 or the intermediate signal SIG_O4 as the target intermediate signal SIG_O5 according to the mode control signal DIV_OPT. The DFF 419 samples the target intermediate signal SIG_O5 according to the reference clock CLK_REF3 to generate the output clock CLK_O3 and the output clock CLK_O4. The output clock CLK_O3 belongs to the output clock group CLK_OUT<N−1:0>, and the output clock CLK_O4 can be used as the intermediate clock D_IN of the succeeding stage. The output clock CLK_O3 and the output clock CLK_O4 are each other's inverted signals.

For the retiming circuit unit 410_N−1 which is electrically connected to the frequency dividing circuit 300, the intermediate clock D_IN is the intermediate clock CLK_DIV_NT, and for the retiming circuit unit 410_J−1 (1≤J≤N−1), the intermediate clock D_IN is the output clock CLK_O4 of the retiming circuit unit 410_J.

In some embodiments, N is a multiple of two and N−1 is a multiple of three, in which case the multiple input clocks CLK_D3 of the retiming circuit 400 can be expressed as "CLK_IN<N−2:0:2,N−2:0:2>" (corresponding to the first divisor D1 being four), and the multiple input clocks CLK_D4 of the retiming circuit 400 can be expressed as "CLK_IN<N−3:1:3,N−2:2:3,N−1:0:3>" (corresponding to the second divisor D2 being six).

Figure 10:
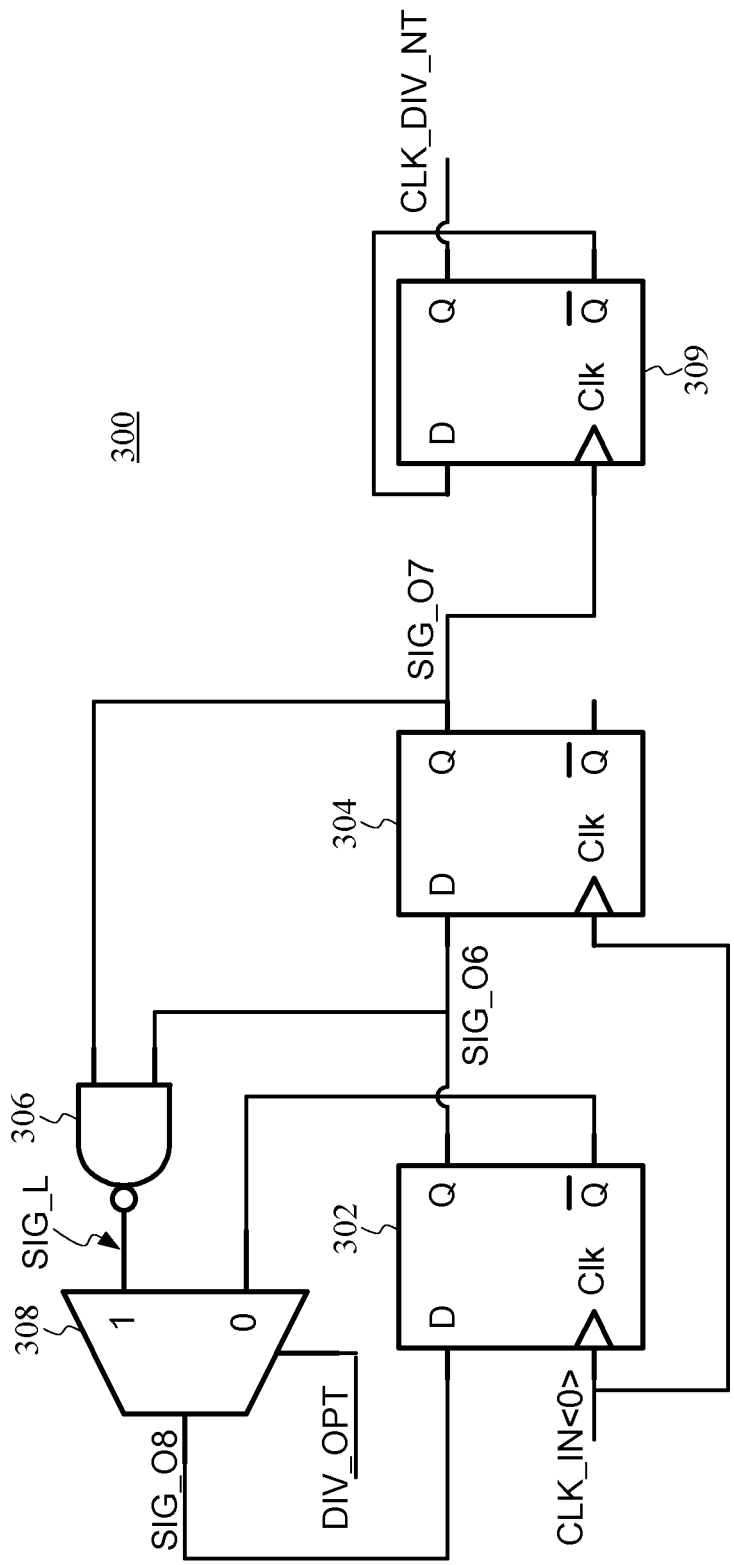
FIG. 10 illustrates a functional block diagram of the frequency dividing circuit 300 according to an embodiment.

FIG. 10 shows a functional block diagram of the frequency dividing circuit 300 according to an embodiment. The frequency dividing circuit 300 includes a DFF 302, a DFF 304, a logic circuit 306, a multiplexer 308, and a DFF 309. The DFF 302 samples the target intermediate signal SIG_O8 according to the input clock CLK_IN<0> to generate the intermediate signal SIG_O6. The DFF 304 samples the intermediate signal SIG_O6 according to the input clock CLK_IN<0> to generate the intermediate signal SIG_O7. The logic circuit 306 generates the logic signal SIG_L according to the intermediate signal SIG_O6 and the intermediate signal SIG_O7. The logic signal SIG_L is equivalent to the inverse of the intersection of the intermediate signal SIG_O6 and the intermediate signal SIG_O7. People having ordinary skill in the art can design the logic circuit 306 according to the relationship between the logic signal SIG_L, the intermediate signal SIG_O6, and the intermediate signal SIG_O7. In some embodiments, the logic circuit 306 can be embodied by a NAND gate. The multiplexer 308 selects the inverted signal of the intermediate signal SIG_O6 or the logic signal SIG_L as the target intermediate signal SIG_O8 according to the mode control signal DIV_OPT. The DFF 309 samples the inverted signal of the intermediate clock CLK_DIV_NT according to the intermediate signal SIG_O7 and generates the intermediate clock CLK_DIV_NT accordingly.

In summary, the design rules of the retiming circuit units 210 and 410 of the present invention can be summarized as follows. In cases where the dual-mode frequency divider circuit 10 or 20 generates N output clocks CLK_OUT<N−1:0> (which equally divide half of the second period Tout) of the same period (the second period Tout=D−Tin, where D is the aforementioned first divisor D1 or second divisor D2, D=2d, and d is a positive integer) according to N input clocks CLK_IN<N−1:0> (which equally divide the first period Tin) of the same period (the first period Tin), the phase difference ΔTph_in between contiguous input clocks CLK_IN<N−1:0> and the phase difference ΔTph_out between contiguous output clocks CLK_OUT<N−1:0> can be expressed by equations (3) and (4), respectively.

$$\Delta \text{Tph\_in} = \frac{1}{N} \cdot \text{Tin} \tag{3}$$

$$\Delta \text{Tph\_out} = \frac{1}{N} \cdot \left(\text{Tin} \cdot D \cdot \frac{1}{2}\right) = \frac{D}{2} \cdot \frac{1}{N} \cdot \text{Tin} \tag{4}$$

The requirement on the total signal transmission time delay between adjacent retiming circuit units 210 (or 410) must satisfy:

$$\Delta T\text{delay}=\Delta Tph_{out}+D\cdot Tin\cdot r(r=0,1,2 \ldots \text{(natural numbers)}) \tag{5}$$

The equivalent transmission delay of one sampling of a signal by a DFF according to the input clock CLK_IN is one first period Tin; the transmission delay attributed to the phase difference between two sampling clocks CLK_IN<i> and CLK_IN<i-x> (x being the clock interval) is x·ΔTph_in; the equivalent signal transmission delay of one inverse operation of a frequency-divided signal is Tout/2 (i.e., D·Tin/2). The total signal transmission delay between two adjacent retiming circuit units 210 (or 410) is:

$$\Delta T\text{delay}=x\cdot \Delta Tph_{in}+y\cdot Tin+z\cdot Tout\cdot \tfrac{1}{2} \tag{6}$$

The dual-mode frequency divider circuits 10 and 20 disclosed in the present invention design various combinations of the values x, y, and z based on the comprehensive consideration of factors such as circuit power consumption, area, and feasibility, so that the total signal transmission time delay obtained according to equation (6) satisfies the requirements of equation (5).

For example, when D=2 (please refer to FIGS. 1-6 with the first divisor D1 being two and the mode control signal DIV_OPT being zero), the requirements of equation (5) can be met by taking x=1, y=2, and z=2 (as shown in the following equation).

$$\Delta Tdelay = 1 \cdot (\Delta Tph_{in}) + \left(Tin + Tout \cdot \frac{1}{2}\right) + \left(Tin + Tout \cdot \frac{1}{2}\right) =$$
$$\frac{2}{2} \cdot \frac{1}{N} \cdot Tin + \left(Tin + 2Tin \cdot \frac{1}{2}\right) + \left(Tin + 2Tin \cdot \frac{1}{2}\right) =$$
$$\frac{2}{2} \cdot \frac{1}{N} \cdot Tin + 2Tin \cdot 2 = \Delta Tph_{out} + D \cdot Tin \cdot 2$$

For another example, when D=4 (please refer to FIGS. 1-4 and 7 with the second divisor D2 being four and the mode control signal DIV_OPT being one), the requirements of equation (5) can be met by taking x=2, y=2, and z=1 (as shown in the following equation).

$$\Delta Tdelay = 2 \cdot (\Delta Tph_{in}) + (Tin) + \left(Tin + Tout \cdot \frac{1}{2}\right) =$$
$$\frac{4}{2} \cdot \frac{1}{N} \cdot Tin + (Tin) + \left(Tin + 4Tin \cdot \frac{1}{2}\right) =$$
$$\frac{4}{2} \cdot \frac{1}{N} \cdot Tin + 4Tin \cdot 1 = \Delta Tph_{out} + D \cdot Tin \cdot 1$$

For another example, when D=4 (please refer to FIGS. 8-10 with the first divisor D1 being four and the mode control signal DIV_OPT being zero), the requirements of equation (5) can be met by taking x=2, y=2, and z=1 (as shown in the following equation).

$$\Delta Tdelay = 2 \cdot (\Delta Tph_{in}) + (Tin) + \left(Tin + Tout \cdot \frac{1}{2}\right) =$$
$$\frac{4}{2} \cdot \frac{1}{N} \cdot Tin + (Tin) + \left(Tin + 4Tin \cdot \frac{1}{2}\right) =$$
$$\frac{4}{2} \cdot \frac{1}{N} \cdot Tin + 4Tin \cdot 1 = \Delta Tph_{out} + D \cdot Tin \cdot 1$$

For still another example, when D=6 (please refer to FIGS. 8 to 10 with the second divisor D2 being six and the mode control signal DIV_OPT being one), the requirements of equation (5) can be met by taking x=3, y=3, and z=1 (as shown in the following equation).

$$\Delta Tdelay = 3 \cdot (\Delta Tph_{in}) + (Tin) + (Tin) + \left(Tin + Tout \cdot \frac{1}{2}\right) =$$
$$\frac{6}{2} \cdot \frac{1}{N} \cdot Tin + (Tin) + (Tin) + \left(Tin + 6Tin \cdot \frac{1}{2}\right) =$$
$$\frac{6}{2} \cdot \frac{1}{N} \cdot Tin + 6Tin \cdot 1 = \Delta Tph_{out} + D \cdot Tin \cdot 1$$

Figure 11:
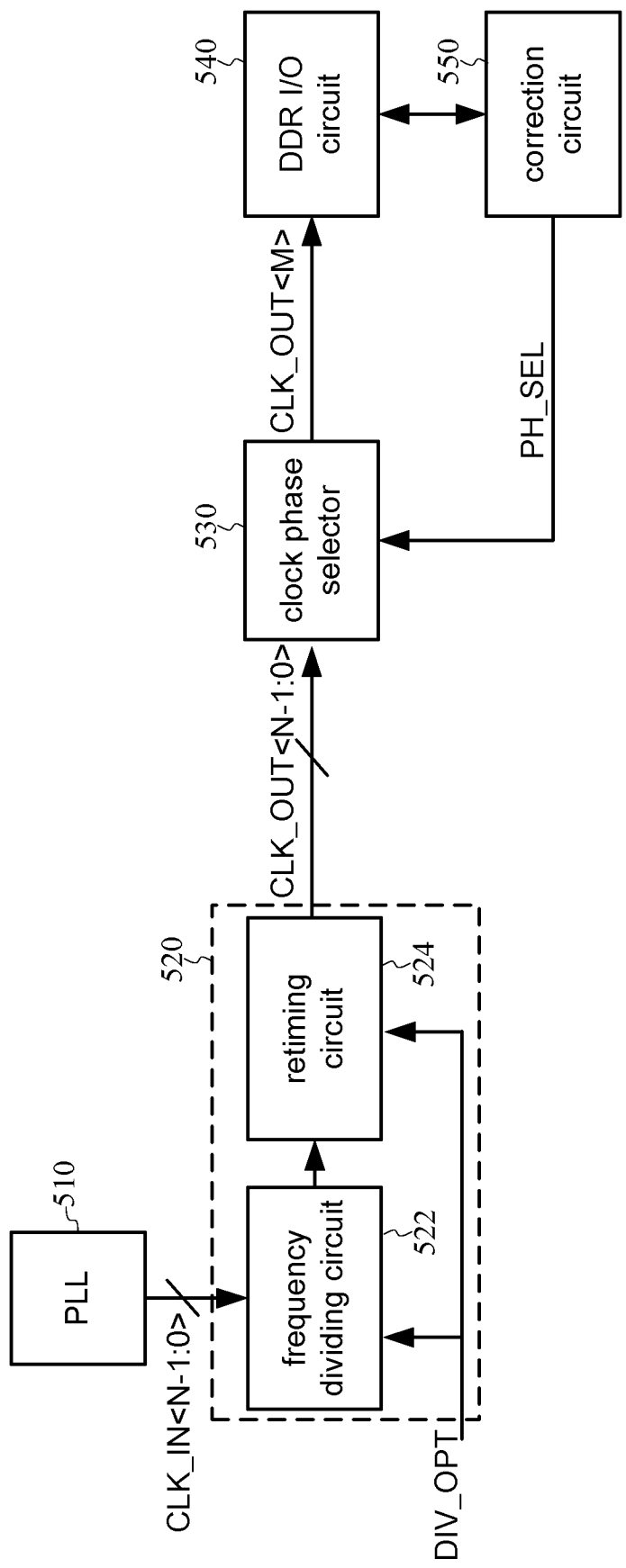
FIG. 11 illustrates a schematic diagram of applying the frequency divider circuit of the present invention to a double data rate (DDR) dynamic random access memory (DRAM) control circuit.

FIG. 11 is a schematic diagram of applying the frequency divider circuit of the present invention to a double data rate dynamic random access memory (DDR DRAM) control circuit. The frequency divider circuit 520 may be the aforementioned dual-mode frequency divider circuit 10 (in which case the frequency dividing circuit 522 and the retiming circuit 524 are the frequency dividing circuit 100 and the retiming circuit 200, respectively) or the dual-mode frequency divider circuit 20 (in which case the frequency dividing circuit 522 and the retiming circuit 524 are the frequency dividing circuit 300 and the retiming circuit 400, respectively). Taking the frequency divider circuit 520 being a 2/4 frequency divider circuit as an example (i.e., corresponding to the embodiments of FIGS. 1 to 4), by setting the mode control signal DIV_OPT, the frequency divider circuit 520 can provide a clock signal of a frequency of 533 MHz (corresponding to the operating frequency of DDR2) when the operating frequency of the phase-locked loop (PLL) 510 is 1066 MHz to 2133 MHz (corresponding to the operating frequency of DDR3); therefore, backward compatibility with DDR2 can be achieved. In other words, in practical applications, the mode control signal DIV_OPT is set according to the type of the DDR DRAM to which the memory control circuit corresponds, that is, it is set according to the type of the DDR DRAM used in the system. By introducing the frequency divider circuit 520, only one PLL 510 is needed to support two or more different DDR DRAM types at the same time. After the output clock group CLK_OUT<N−1:0> generated by the frequency divider circuit 520 is subjected to the selection by the clock phase selector 530 according to the phase selection signal PH_SEL, the clock signal CLK_OUT<M> is generated (0≤M≤N−1). Using the clock signal CLK_OUT<M> as a trigger clock, the DDR I/O (input/output) circuit 540 sends data to the DRAM (not shown) and receives from the DRAM the return data that corresponds to the data. The correction circuit 550 generates the phase selection signal PH_SEL according to the output (e.g., the return data) of the DDR I/O circuit 540 to control the clock phase selector 530.

Figure 12:
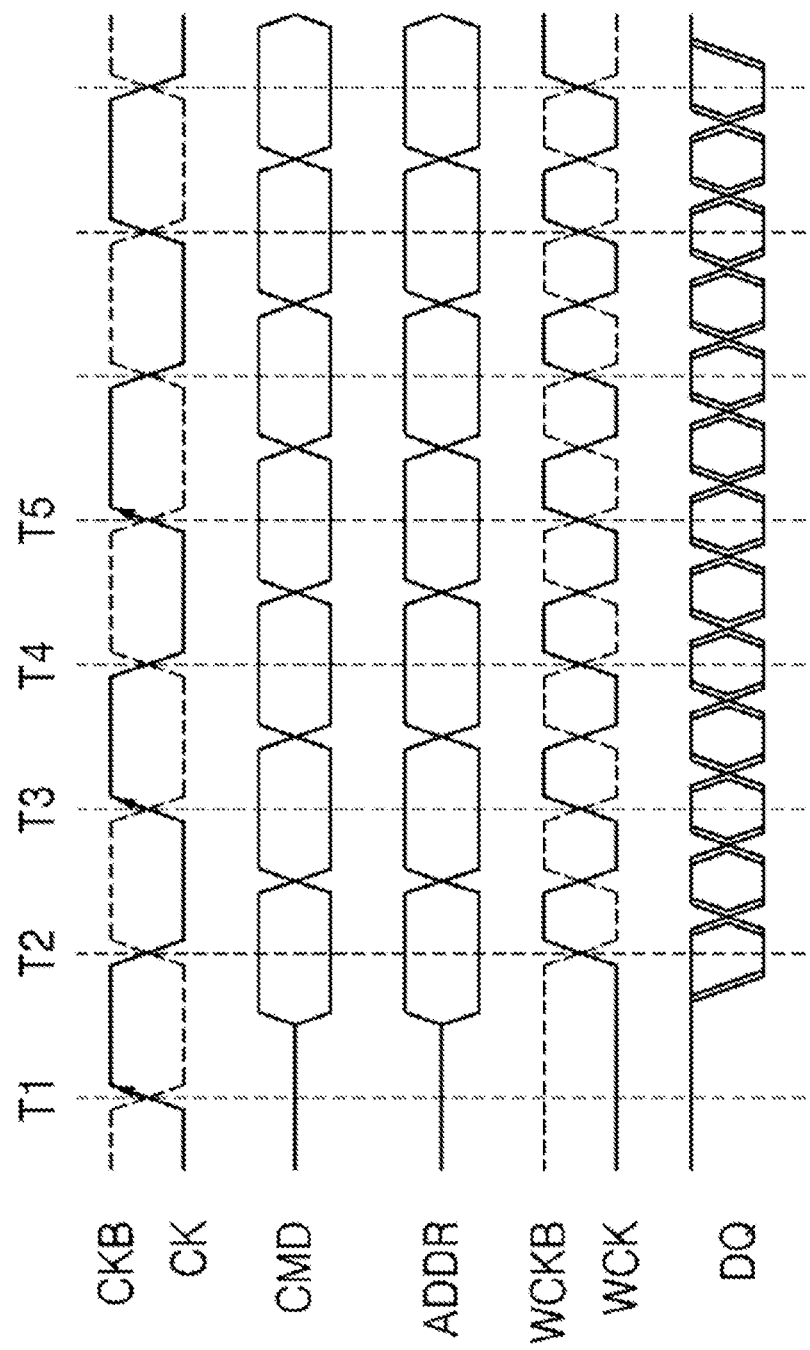
FIG. 12 illustrates a schematic diagram of the operation timing sequence of the DDR I/O circuit 540.
Figure 13:
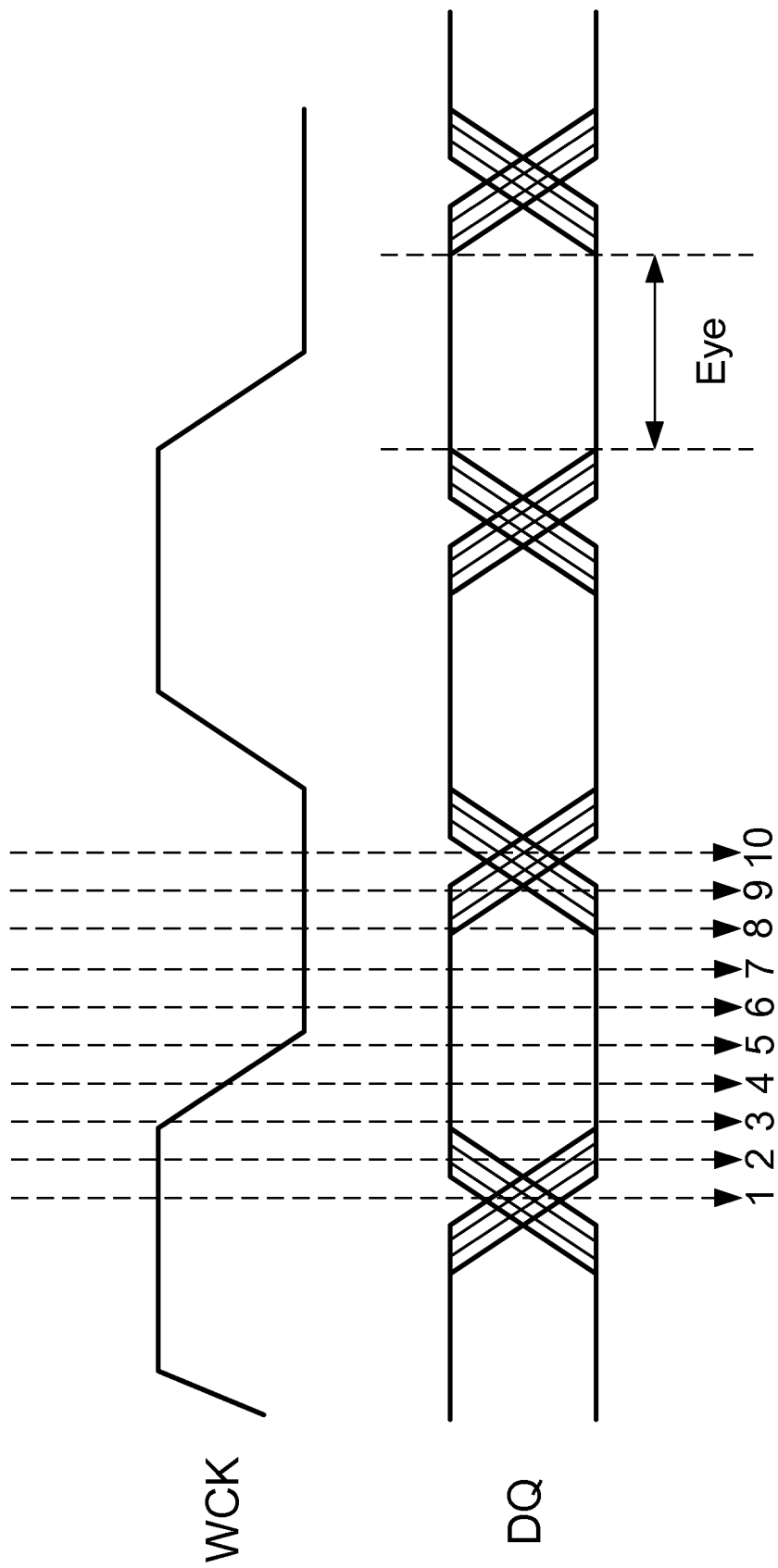
FIG. 13 illustrates a schematic diagram of the determination of the clock phase by the correction circuit.

FIG. 12 is a schematic diagram of the operation timing sequence of the DDR I/O circuit 540. When transmitting the data signal DQ, the DDR I/O circuit 540 also transmits the clock signal CK (CKB being the inverted signal of the clock signal CK) or the data clock signal WCK (WCKB being the inverted signal of the data clock signal WCK) along with the data signal DQ. The clock signal CK or the data clock signal WCK is used to sample the data signal DQ. In practice, issues of phase mismatch between the clock signal CK (or the data clock signal WCK) and the data signal DQ due to factors such as variations in the manufacturing process are likely to arise, resulting in the failure of correctly sampling the content of the data signal DQ. The correction circuit 550 is used to correct the phase mismatch between the clock signal CK (or the data clock signal WCK) and the data signal DQ. In a training process upon booting, the DDR I/O circuit 540 transmits a known data pattern and receives the return data, and then the correction circuit 550 samples the received data using multiple different phases, followed by comparing the sampled results corresponding to each phase with the known data to determine a better phase of the clock signal CLK_OUT<M>, according to which the correction circuit 550 sets the phase selected by the clock phase selector 530. FIG. 13 is a schematic diagram of the determination of the clock phase by the correction circuit. The phases 3 to 8 of the data clock signal WCK (i.e., the clock signal CLK_OUT<M>) fall within the "Eye" (in which the data are relatively certain) of the data signal DQ. Since among the phases 3 to 8, the phases 4 to 7 are better options, the correction circuit 550 uses the phase selection signal PH_SEL to control the clock phase selector 530 to select the clock signal CLK_OUT<M> corresponding to one of the phases 4 to 7.

Although the embodiments discussed above are illustrated by taking the 2/4 mode (i.e., the divisors D1/D2=2/4, as embodied by the dual-mode frequency divider circuit 10)

and the 4/6 mode (i.e., the divisors D1/D2=4/6, as embodied by the dual-mode frequency divider circuit 20) as examples, these embodiments are intended to illustrate the invention by way of examples, rather than to limit the scope of the claimed invention. People having ordinary skill in the art can appropriately apply the present invention to dual-mode frequency divider circuits of other frequency ratios (i.e., divisors) based on the disclosure of the present invention. In addition, although the embodiments discussed above use DFFs to implement the frequency divider circuit of the present invention, people having ordinary skill in the art can choose other types of flip-flops to implement the frequency divider circuit of the present invention based on the disclosure of the present invention.

In comparison with the conventional technology, the dual-mode frequency divider circuit of the present invention has a longer setup time (i.e., easier to meet the setup time requirement), and can therefore achieve a higher signal processing speed.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A frequency divider circuit for processing a plurality of input clocks, comprising:
   a frequency dividing circuit for generating an intermediate clock according to a first subgroup of the input clocks; and
   a retiming circuit for generating a plurality of output clocks according to a second subgroup of the input clocks and the intermediate clock;
   wherein periods of the input clocks are a first period, periods of the output clocks are a second period, the first period is smaller than the second period, the frequency dividing circuit and the retiming circuit operate according to a mode control signal, and the mode control signal determines a ratio of the first period to the second period.

2. The frequency divider circuit of claim 1, wherein a total number of the input clocks is N which is a positive integer, a total number of the output clocks generated by the retiming circuit is N−1, and an inverted signal of the intermediate clock is another output clock.

3. The frequency divider circuit of claim 1, wherein when the mode control signal is a first logical value, the ratio is two; when the mode control signal is a second logical value, the ratio is four.

4. The frequency divider circuit of claim 1, wherein the second subgroup comprises an input clock, and the retiming circuit comprises a retiming circuit unit, the retiming circuit unit comprising:
   a first multiplexer for receiving the input clock and selecting the input clock as a reference clock according to the mode control signal;
   a first flip-flop for sampling the intermediate clock according to the reference clock to generate an intermediate signal;
   a second multiplexer for selecting one of the intermediate signal and an inverted signal of the intermediate signal as a target intermediate signal according to the mode control signal; and
   a second flip-flop for sampling the target intermediate signal according to the reference clock to generate one of the output clocks.

5. The frequency divider circuit of claim 1, wherein the second subgroup comprises a first input clock and a second input clock, the retiming circuit comprises a first retiming circuit unit and a second retiming circuit unit that are connected in sequence, the first retiming circuit unit generates a first output clock of the output clocks, and the second retiming circuit unit generates a second output clock of the output clocks, the second retiming circuit unit comprising:
   a first multiplexer for receiving the first input clock and the second input clock, and selecting one of the first input clock and the second input clock as a reference clock according to the mode control signal;
   a first flip-flop for sampling an inverted signal of the first output clock according to the reference clock to generate an intermediate signal;
   a second multiplexer for selecting one of the intermediate signal and an inverted signal of the intermediate signal as a target intermediate signal according to the mode control signal; and
   a second flip-flop for sampling the target intermediate signal according to the reference clock to generate the second output clock.

6. The frequency divider circuit of claim 1, wherein the first subgroup comprises a first input clock and a second input clock, the frequency dividing circuit comprising:
   a first multiplexer for receiving the first input clock and the second input clock, and selecting one of the first input clock and the second input clock as a reference clock according to the mode control signal;
   a second multiplexer for receiving an intermediate signal and the intermediate clock, and selecting one of the intermediate signal and the intermediate clock as a reference signal according to the mode control signal;
   a first flip-flop for sampling the reference signal according to the reference clock to generate an inverted signal of the intermediate signal; and
   a second flip-flop for sampling the inverted signal of the intermediate signal according to the reference clock to generate the intermediate clock.

7. The frequency divider circuit of claim 1, wherein the intermediate clock is a first intermediate clock, inverted signals of the output clocks are a plurality of second intermediate clocks, and the retiming circuit comprises a retiming circuit unit that samples a target intermediate clock of the second intermediate clocks according to a target input clock of the second subgroup to generate one of the output clocks.

8. The frequency divider circuit of claim 1, wherein the intermediate clock is a first intermediate clock, inverted signals of the output clocks are a plurality of second intermediate clocks, the retiming circuit comprises a first retiming circuit unit and a second retiming circuit unit, the first retiming circuit unit samples a first target intermediate clock of the second intermediate clocks according to a first target input clock of the second subgroup to generate a second target intermediate clock of the second intermediate clocks, the second retiming circuit unit samples the second target intermediate clock according to a second target input clock of the second subgroup, and the second target input clock leads the first target input clock and the second target intermediate clock.

9. The frequency divider circuit of claim 1, wherein a total number of the input clocks is N, the frequency divider circuit outputs N output clocks, N is a positive integer, the N input clocks equally divide a phase of 360 degrees, and the N output clocks equally divide a phase of 180 degrees.

10. The frequency divider circuit of claim 1, wherein a total number of the input clocks is N, the frequency divider circuit outputs N output clocks, N is a positive integer, a greatest phase difference between the N input clocks is greater than 180 degrees, and a greatest phase difference between the N output clocks is less than 180 degrees.

11. A frequency divider circuit for processing a plurality of input clocks, comprising:
   a frequency dividing circuit for generating a first intermediate clock according to a first subgroup of the input clocks; and
   a retiming circuit for generating a plurality of output clocks according to a second subgroup of the input clocks and the first intermediate clock;
   wherein periods of the input clocks are a first period, periods of the output clocks are a second period, the first period is smaller than the second period, the frequency dividing circuit and the retiming circuit operate according to a mode control signal, and the mode control signal determines a ratio of the first period to the second period;
   wherein the retiming circuit comprises a plurality of retiming circuit units, the retiming circuit units comprise a first retiming circuit unit and a second retiming circuit unit, the first retiming circuit unit generates a second intermediate clock according to a first input clock of the second subgroup, and the second retiming circuit unit generates a first output clock of the output clocks according to a second input clock of the second subgroup and the second intermediate clock;
   wherein the second input clock leads the first input clock and the first output clock.

12. The frequency divider circuit of claim 11, wherein the frequency dividing circuit is composed of S multiplexers and L flip-flops, and each of the retiming circuit units is composed of K multiplexers and Z flip-flops; S is equal to K, L is equal to Z, and S, L, K, and Z are positive integers.

13. The frequency divider circuit of claim 11, wherein a total number of the input clocks is N, N is a positive integer, and the first period is Tin;
   wherein the retiming circuit units further comprise a third retiming circuit unit for generating a second output clock of the output clocks according to a third intermediate clock generated by the second retiming circuit unit and a third input clock of the second subgroup;
   wherein when the mode control signal is a first logical value, a phase difference between the first input clock and the second input clock is M times Tin/N, a phase difference between the second input clock and the third input clock is M times Tin/N, and M is a positive integer greater than one.

14. The frequency divider circuit of claim 11, wherein the frequency divider circuit is applied to a memory control circuit, and the mode control signal is determined according to a memory type corresponding to the memory control circuit.

15. The frequency divider circuit of claim 14, wherein the memory control circuit comprises:
   a clock phase selector for receiving the output clocks, and outputting a target output clock selected from the output clocks according to a phase selection signal;
   an input/output circuit for outputting a data according to the target output clock; and
   a correction circuit for generating the phase selection signal according to a return data that the input/output circuit receives and corresponds to the data.

* * * * *